(12) United States Patent
Gregorius

(10) Patent No.: US 7,292,662 B2
(45) Date of Patent: Nov. 6, 2007

(54) FEED FORWARD CLOCK AND DATA RECOVERY UNIT

(75) Inventor: Peter Gregorius, Munich (DE)

(73) Assignee: Infineon Technologies AG, Munich (DE)

( * ) Notice: Subject to any disclaimer, the term of this patent is extended or adjusted under 35 U.S.C. 154(b) by 694 days.

(21) Appl. No.: 10/810,981

(22) Filed: Mar. 26, 2004

(65) Prior Publication Data

US 2004/0202261 A1 Oct. 14, 2004

Related U.S. Application Data

(60) Provisional application No. 60/457,812, filed on Mar. 26, 2003.

(51) Int. Cl.
*H04B 1/10* (2006.01)
*H04L 7/00* (2006.01)
*H03D 3/24* (2006.01)

(52) U.S. Cl. .................. 375/350; 375/355; 375/375

(58) Field of Classification Search ................ 375/326, 375/327, 350, 354, 355, 371, 373, 375, 376

See application file for complete search history.

(56) References Cited

U.S. PATENT DOCUMENTS 5,400,370 A * 3/1995 Guo ......................... 375/371
6,009,132 A * 12/1999 Scholtz ..................... 375/355
2002/0080898 A1 6/2002 Agazzi et al.
2002/0146084 A1 10/2002 Cranford, Jr. et al.
2003/0031283 A1* 2/2003 Bronfer et al. ............. 375/371
2003/0123594 A1* 7/2003 Glenn et al. ................ 375/373
2004/0210790 A1* 10/2004 Moon et al. ................ 713/500

FOREIGN PATENT DOCUMENTS

DE 19922807 A1 11/1999

OTHER PUBLICATIONS

German Office Action dated Sep. 22, 2005.

* cited by examiner

*Primary Examiner*—Don N. Vo
(74) *Attorney, Agent, or Firm*—Jenkins, Wilson, Taylor & Hunt, P.A.

(57) ABSTRACT

Disclosed is a feed forward clock and data recovery unit for recovering a received serial data bit stream having a feed forward phase tracking unit for tracking of a sampling time to the center of a unit interval of the received data bit stream. The feed forward phase tracking unit can include a sampling phase generation unit, an oversampling unit, a serial-to-parallel-conversion unit, a binary phase detection unit, a loop filter, a finite state machine, a binary rotator, and a data recognition unit for recovery of the received data stream which includes a number of parallel data recognition FIR-Filters. Further, each data recognition FIR-Filter can include a weighting unit for weighting data samples of the deserialized data stream, a summing unit for summing up the weighted data samples, and a comparator unit for comparing the summed up data samples with a threshold value.

36 Claims, 18 Drawing Sheets

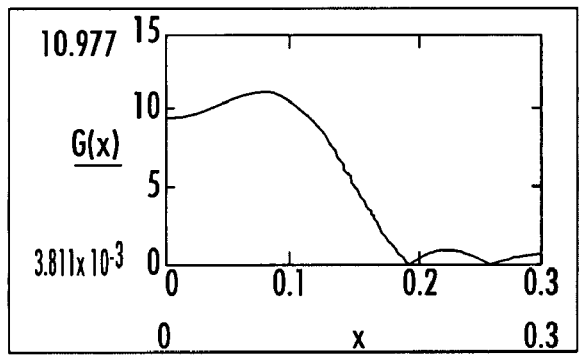
FIG. 15a
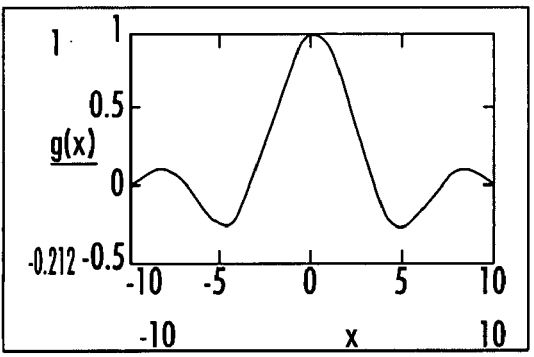
FIG. 15b
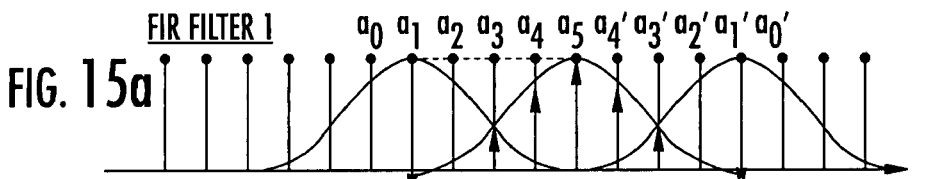
FIG. 15a
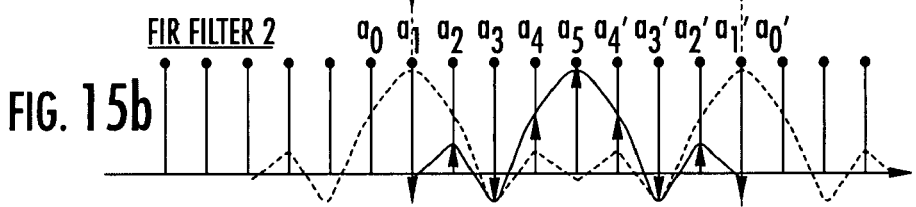
FIG. 15b
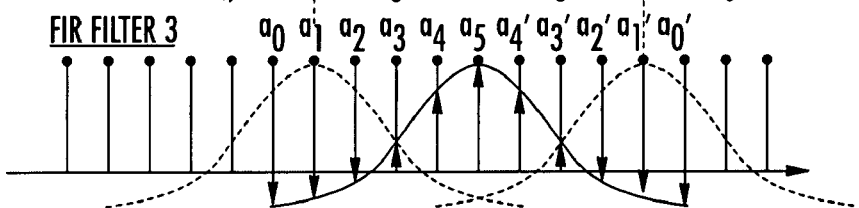
FIG. 15c
FIG. 15
| | FILTER COEFICIENTS | | |
|---|---|---|---|
| | FILTER A | FILTER B | FILTER C |
| $a_0$ | 0 | 0 | -18 |
| $a_1$ | -1 | -6 | -14 |
| $a_2$ | 0 | 8 | -8 |
| $a_3$ | 20 | -13 | 17 |
| $a_4$ | 50 | 40 | 50 |
| $a_5$ | 64 | 64 | 64 |
| $a_4'$ | 50 | 40 | 50 |
| $a_3'$ | 20 | -13 | 19 |
| $a_2'$ | 0 | 8 | -6 |
| $a_1'$ | -1 | -6 | -14 |
| $a_0'$ | 0 | 0 | -18 |

FEED FORWARD CLOCK AND DATA RECOVERY UNIT

RELATED APPLICATIONS

This application claims the benefit of U.S. Provisional Patent Application Ser. No. 60/457,812, filed Mar. 26, 2003, the disclosure of which is incorporated herein by reference in its entirety.

TECHNICAL FIELD

The invention refers to a feed forward clock and data recovery unit and a method for clock and data recovery which are provided for recovery of data pulses which have been subjected to severe noise on a transmission line/channel.

BACKGROUND ART

The band limitation of the transmission channel results in the data signal at the receiver being subjected to distortion caused by intersymbol interference (ISI). The received signal itself contains both deterministic and stochastic edge noise.

The clock and data recovery unit according to the present invention provides for a reliable recovery of the data in a severely noisy environment and can be used in a multichannel application (Multiple Lane Application). The achieved BER is very low (Error rate BER<10^-15) even when the received data signal has only a small eye opening.

For high-speed data transmission, the requirements for the transceiver modules to have high speeds, low bit error rates (Bit Error Rate BER) and a long range are becoming more stringent. Depending on the channel and transmission medium, it is necessary to transmit data in the Gigahertz range, for example at 2.488 Gbit/s to 10 Gbit/s, with as few bit errors as possible.

The circuits for data recovery within the transceiver modules are referred to as clock and data recovery units (CDR). There are two fundamental concepts for data recovery according to the state of the art, i.e. phase alignment and phase picking.

FIG. 1 shows a clock and data recovery unit according to the state of the art as employed in a digital receiver.

Caused by clock jitter, band limitation of the data channels, intersymbol interferences (ISI) as well as reflections and crosstalk between the channels the effective usable signal eye opening is only approximately 35% or even smaller than of the respective data bit cell, so that in a 3,125 Gbit/s real bit data stream (NRZ=non return to zero)-modulated data has only a signal eye opening for each unit interval (UI) having a length of 112 ps while the rest of the bit cell is disturbed by clock jitter, intersymbol interferences (ISI) and reflections.

In the phase adjustment (phase alignment) method according to the state of the art a phase locked loop (PLL) is used to set the sampling time to the signal eye center of the received signal (bit cell). An edge-control D-flipflop which is generally used for recovering and synchronization samples the data applied at the D-input by means of the rising edge at the clock input.

FIG. 2 shows a PLL-based clock recovery system according to the state of the art.

In the phase picking method according to the state of the art in simple terms, the input signal is oversampled by connecting two or more D-flipflops in parallel, which are clocked with stepped clock phases. For data recovery, a control circuit then chooses the output of that D-flipflop whose clock phase represents the optimum sampling time in the eye center.

Both conventional methods can be implemented in widely differing ways. Different kinds of both multiphase circuits or phase locked loops PLL can be used for implementation of the phase alignment method and the phase picking method.

Both conventional methods according to the state of the art require a phase detector PD, which assesses the phase angle $\phi$ of the input data signal with respect to the clock phase $\phi_{CLK}$ within the clock and data recovery unit. A digital phase detector PD can be regarded as an edge-control switching mechanism to which the received signal on the one hand and a clock phase on the other hand are supplied, and which detects the phase angle $\phi$ by means of internal stage transitions. One fundamental disadvantage of such digital phase detectors PD is the fact that the received signal is normally distorted and interfered with by various unavoidable effects in the transmission channel, such as reflections, attenuation, channel crosstalk and intersymbol interference (ISI).

In conventional phase adjustment methods according to the state of the art a digital phase detector PD is provided in which the received data signal acts directly on edge-sensitive inputs, so that the above mentioned signal disturbances generally lead to incorrect assessments of the. phase angle $\phi$. Provided that they do not occur excessively frequently, these incorrect assessments can be sufficiently suppressed by use of a very inert control system so that the signal disturbances do not immediately lead to unlocking of the phase locked loop PLL. However, an incorrect assessment of the phase angle $\phi$ leads to a reduction in the jitter budget even when using an inert control system, so that the received data signal needs to have a larger signal eye opening for the same bit error rate BER than would be the case with a phase detector PD that is less sensitive to the above mentioned signal disturbances. A further disadvantage of a inert control system is that the phase locked loop PLL takes longer to lock in.

With the conventional phase alignment methods, the data detection (recovery) is carried out at the data rate DR. The control loop for phase adjustment does not have to achieve the BER<10^-15, but the regenerative flipflop must have appropriate stability. Metastability of the flipflop leads to incorrect decisions in data recovery.

In order to avoid these disadvantages of phase adjustment methods in phase picking CDRs according to the state of the art the phase information is not obtained directly from the received data input signal, but the received data signal is oversampled and the phase angle $\phi$ is derived from the oversampled signal.

FIG. 3a, 3b show a phase picking data recovery system according to the state of the art.

In a phase picking data recovery system as shown in FIG. 3a multiple clock phases sample each data bit from the received serial data stream at multiple positions. The phase picking data recovery system detects data transitions and picks the data sample which is furthest away from the detected data transition. By delaying the data samples while the decision is made the phase picking data recovery system as shown in FIG. 3a employs a feed forward loop. Because stability constrains are absent the phase picking method achieves a very high bandwidth and track phase movements on a cycle-cycle-basis. However, the tracking can occur only at quantisised steps depending on the degree of oversampling. The phase picking decision causes some latency.

A principle disadvantage of conventional phase alignment methods and phase picking methods according to the state of the art is that only a small part of the received data signal is effectively used for the decision, wherein the usable signal part is defined by the position of the clock edge and the set and hold times of the decision circuit. To avoid infringement of the setup and hold times of the decision circuit which causes a metastability and so to a undefined logic value the decision circuit is implemented such that its setup and hold times are as small as possible. Accordingly the signal part around the clock edge which is in fact evaluated is very short and accordingly the evaluated signal energy is very low. High frequent disturbances such as high frequent noise leads in particular at very small signal eyes to an increased bit error rate (BER). Undesired high frequent noise can be provided on the supply voltage of the clock and data recovery unit or can be applied together with the received data signal.

To avoid the sensitivity of the clock and data recovery unit because of the small signal power of the sampled signal it is known to use current integrating receivers. In this current integrating receivers the differential data input signal is integrated during a time period corresponding to the unit interval UI of a bit cell. At the end of the bit cell it is evaluated whether the current integral is positive or negative to recover the data bit. However, in a communication system wherein the usable signal eye opening is only in the range of 35% or even smaller of the received bit cell a current integrating receiver can not be employed, because the distorted and disturbed signal portions would be outside the usable signal eye opening.

A conventional clock and data recovery units according to the state of art has the disadvantage that they comprise feed back loops. This leads to band limitation, so that the clock and data recovery unit is less tolerant to phase jitter.

A further disadvantage of clock and data recovery units according to the state of the art having feed back loops is that because of time latency in the feed back loop self-oscillating can occur. Accordingly conventional clock and data recovery units with feed back loops are not suited for a serial data stream having a data rate of more than one gigabit per second.

SUMMARY OF THE INVENTION

Accordingly it is the object of the present invention to provide a clock and data recovery unit and a method for recovering a received high frequent serial data stream which are insensitive to phase jitter of a received serial data bit stream.

This object is achieved by a clock and data recovery unit having the features of main claim 1.

FIG. 6b shows the phase detector gain of the clock and data recovery unit according to a preferred embodiment of the present invention.

The invention provides a clock and data recovery unit for recovering a received serial data bit stream having (a) feed forward tracking means for tracking of a sampling time to the center of a unit interval (UI) of the received data bit stream, wherein the phase tracking means comprises:

(a1) a sampling phase generation means for generating equidistant sample phase signals which are output with a predetermined granularity;

(a2) an oversampling unit (OSU) for oversampling the received data stream with the sample phase signals according to a predetermined oversampling rate (OSR);

(a3) a serial-to-parallel-conversion unit which converts the oversampled data stream into a deserialized data stream with a predetermined decimation factor (DF);

(a4) a binary phase detection unit (BPD) for detecting an average phase difference (APD) between the received serial data bit stream and the reference phase signal by adjusting a phase detector gain (PDG) depending on the actual data density (DD) of the deserialized data stream such that the variation of the average phase detection gain (PDG) is minimized; and (a5) a loop filter for tracking of a phase offset of the detected average phase difference around an ideal sampling time at the center of the unit interval (UI) to generate a fine track control signal;

(a6) a finite state machine (FSM) which generates a coarse shift control signal when the average phase difference (APD) exceeds a predetermined threshold value;

(a7) a binary rotator which rotates the deserialized data stream in response to the coarse shift control signal and the fine track control signal;

(b) data recognition means (DRM) for recovery of the received data streams which includes a number of parallel recognition FIR-Filters wherein each recognition FIR-Filter comprises:

(b1) a weighting unit for weighting data samples of the parallised data stream around the sampling time adjusted by the phase adjustment means;

(b2) a summing unit for summing up the weighted data samples; and (b3) a comparator unit for comparing the summed up data samples with a threshold value to detect the logic value of a data bit within the received serial data bit stream.

An advantage of the clock and data recovery unit according to the present invention is that the technical implementation is completely in the digital domain.

Since there is no feedback loop no oscillating can occur even with high data bit rates having a data rate of more than one gigabit per second.

Since no feed back loops are implemented the technical complexity of the clock and data recovery unit according to the present invention is comparatively low.

A further advantage of the clock and data recovery unit according to the present invention is that redundant data information which are used for phase synchronization is at the same time used for recovery of the serial data bit stream. Accordingly the data recovery unit is very robust in a noisy environment.

The clock and data recovery unit according to the present invention is very robust with respect to variations or jitter of the sampling phase.

A further advantage of the clock and data receiver unit according to the present invention is that the same circuitry is used for two different functions at the same time, i.e. for phase tracking and for data recognition.

In a preferred embodiment the clock and data recovery unit according to the present invention a bit alignment unit is provided which applies data samples generated by said oversampling unit within one unit interval (UI) simultaneously at the serial-to-parallel-conversion unit.

In a preferred embodiment of the clock and data recovery unit according to the present invention the finite state machine comprises a first memory for storing at least one phase threshold value and a second memory for storing for each phase hold threshold value a corresponding coarse shift coefficient.

In a preferred embodiment of the clock and data recovery unit according to the present invention the finite state machine comprises a comparator for comparing the average phase difference with the at least one phase threshold value and outputs a corresponding coarse shift coefficient.

In a preferred embodiment the phase threshold values are programmable.

In a preferred embodiment the coarse shift coefficients are also programmable.

In a preferred embodiment of the clock and data recovery unit according to the present invention the finite state machine comprises a multiplicator for multiplying a coarse shift coefficient output by said comparator with a sign value of average phase difference.

In a preferred embodiment of the clock and data recovery unit according to the present invention the binary rotator comprises a shift register for storing data samples of the deserialized data stream of a more than one unit interval (UI) and a barrel shifter which rotates all data samples of one unit interval (UI) and some of the neighboring data samples of the preceding unit interval and of a following unit interval in response to the coarse shift control signal and the fine track control signal.

In a preferred embodiment the clock and data recovery unit according to the present invention comprises means for detecting the actual data density (DD) of the deserialized data bit stream and means for adjusting the phase detector gain (PDG) depending on the detected actual data density (DD).

In a preferred embodiment of the clock and data recovery unit according to the present invention the means for detecting the actual data density comprises a plurality of EXOR gates, wherein each EXOR gate compares two neighboring data samples generated by the oversampling unit to decide whether a data transition has occurred.

In a preferred embodiment of the clock and data recovery unit according to the present invention the means for detecting the actual data density further comprises summation means for accumulating the number of data transitions detected by the EXOR gates.

In a preferred embodiment of the clock and data recovery unit according to the present invention the means for adjusting the phase detector gain calculates the phase detector gain by multiplying the accumulated number of data transitions with a multiplication factor (MF).

In a preferred embodiment of the clock and data recovery unit according to the present invention the multiplication factor (MF) is increased when the detected number of data transition has decreased.

In a preferred embodiment of the clock and data recovery unit according to the present invention the number (N) of EXOR gates for detection of the actual data density is given by the product of the decimation factor (DF) of the serial-to-parallel-conversion unit and the oversampling rate (OSR) of the oversampling unit:

$$N = DF \times OSR$$

In a preferred embodiment of the clock and data recovery unit according to the present invention the decimation factor (DF) of the serial-to-parallel-conversion unit is eight (DF=8).

In a preferred embodiment of the clock and data recovery unit according to the present invention the oversampling rate (OSR) of the oversampling unit is four (OSR=4).

In a preferred embodiment of the clock and data recovery unit according to the present invention the data transmission rate (DR) of the serial data bit stream is more than one Gigabit per second.

$$DR \geq 1 \text{ Gbit/sec}$$

In a preferred embodiment of the clock and data recovery unit according to the present invention the weighting unit of the data recognition means comprises signal amplifiers, wherein each signal amplifier amplifies a respective data sample with a programmable gain.

In a preferred embodiment of the clock and data recovery unit according to the present invention the data recognition FIR-Filters of the data recognition means are connected to a FIFO-register.

In a preferred embodiment of the clock and data recovery unit according to the present invention the number of data recognition FIR-Filters corresponds to the decimation factor (DF) of the serial-to-parallel-low-conversion unit.

In a preferred embodiment of the clock and data recovery unit according to the present invention the oversampling unit comprises a predetermined number of clock triggered sampling elements.

In a preferred embodiment the sampling elements are D-Flipflops.

In an alternative embodiment the sampling elements are D-Latches.

In a preferred embodiment of the clock and data recovery unit according to the present invention each sampling element is clocked by a corresponding reference phase signal generated by the phase interpolation unit.

In a preferred embodiment of the clock and data recovery unit according to the present invention the means for generating equidistant sampling phase signals receives a reference clock signal from a reference clock generator.

In a preferred embodiment of the clock and data recovery unit according to the present invention the reference clock generator is formed by a phase locked loop (PLL).

In a preferred embodiment of the clock and data recovery unit according to the present invention a lock detection unit is provided which detects whether the clock and data recovery unit is locked to the received serial data bit stream.

In a preferred embodiment of the clock and data recovery unit according to the present invention a transition loss detection unit is provided which detects when the serial data bit stream has stopped.

In a preferred embodiment of the clock and data recovery unit according to the present invention the digital control unit further includes the lock detection unit and the transition loss detection unit.

In a preferred embodiment of the clock and data recovery unit according to the present invention the equidistant reference phase signals have a phase difference $\Delta\phi$ of 45° to define eight phase segments.

In a preferred embodiment of the clock and data recovery unit according to the present invention the phase interpolation unit interpolates phase signals in each phase segment on the basis of the equidistant reference phase signals.

The invention further provides a method for clock and data recovery of a received serial data stream comprising the following steps:

(a1) oversampling the received data bit stream with sampling phase signals having a predetermined granularity;

(a2) converting the oversampled data bit stream into a deserialized data stream;

(a3) detecting an average phase difference (AVG_PH) between the received serial data bit stream and the sampling phase signals by adjusting a phase detector gain (PDG) depending on the data density (DD) of the parallised data stream to minimize the variation of the deserialized average phase detector gain;

(a4) filtering the detected average phase difference for generating a fine track control signal provided for tracking a small phase offset of the average phase signal around an ideal sampling point at the center of the unit interval (UI);

(a5) comparing the detected average phase difference with at least one threshold value to generate a coarse shift control signal;

(a6) rotating the deserialized data stream in response to the coarse shift control signal and the fine track control signal by means of a binary rotator;

(b1) weighting data samples of the deserialized data stream around the ideal sampling time;

(b2) summing up the weighted data samples;

(b3) comparing the summed up weighted data samples with a threshold value to detect the logic value of a data bit within the serial data bit stream.

In the following preferred embodiments of the clock and data recovery unit according to the present invention and the method for clock and data recovery are described with reference to the enclosed figures.

BRIEF DESCRIPTION OF THE DRAWINGS

FIG. 15a shows a transfer function of a data recognition FIR-Filter according to the present invention.

FIG. 15b shows a corresponding impulse response of a data recognition FIR-Filter according to the present invention.

FIG. 15c shows an impulse response of FIR-Filters as employed in the data recognition unit according to the present invention.

DETAILED DESCRIPTION OF THE INVENTION

Figure 1:
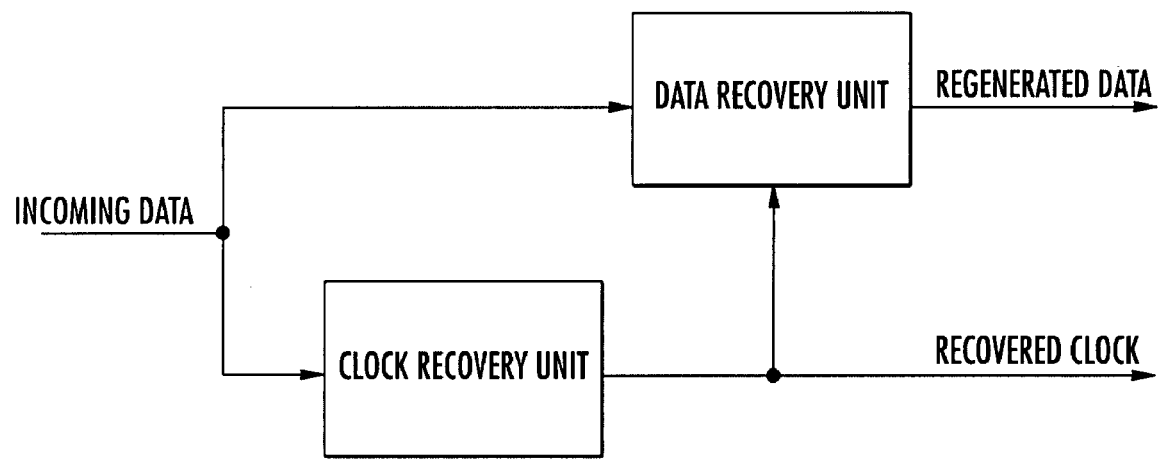
FIG. 1 shows a clock and data recovery unit according to the state of the art.
Figure 2:
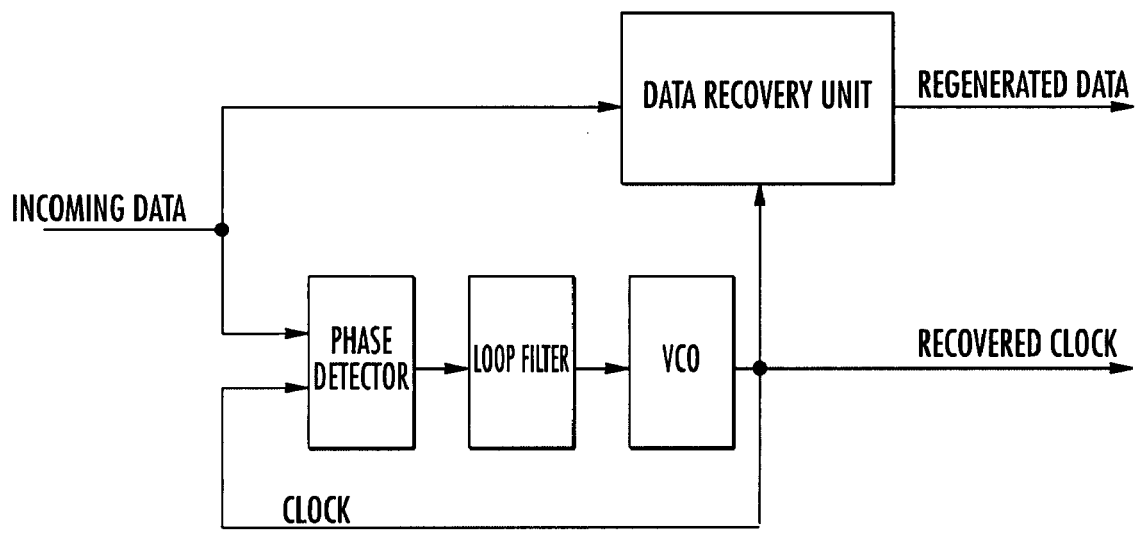
FIG. 2 shows a PLL based clock recovery system according to the state of the art.
Figure 3A:
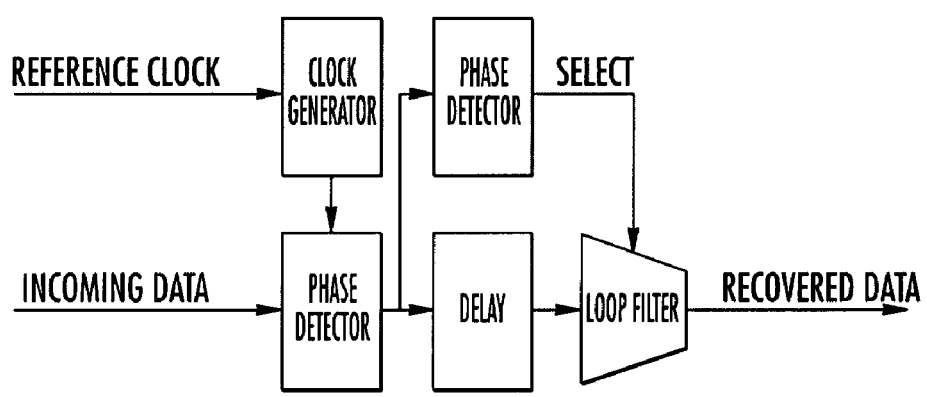
FIG. 3a, 3b show a phase picking data recovery system according to the state of the art.
Figure 3B:
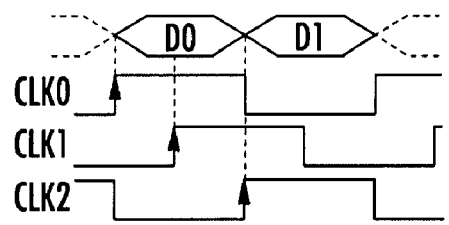
Figure 4:
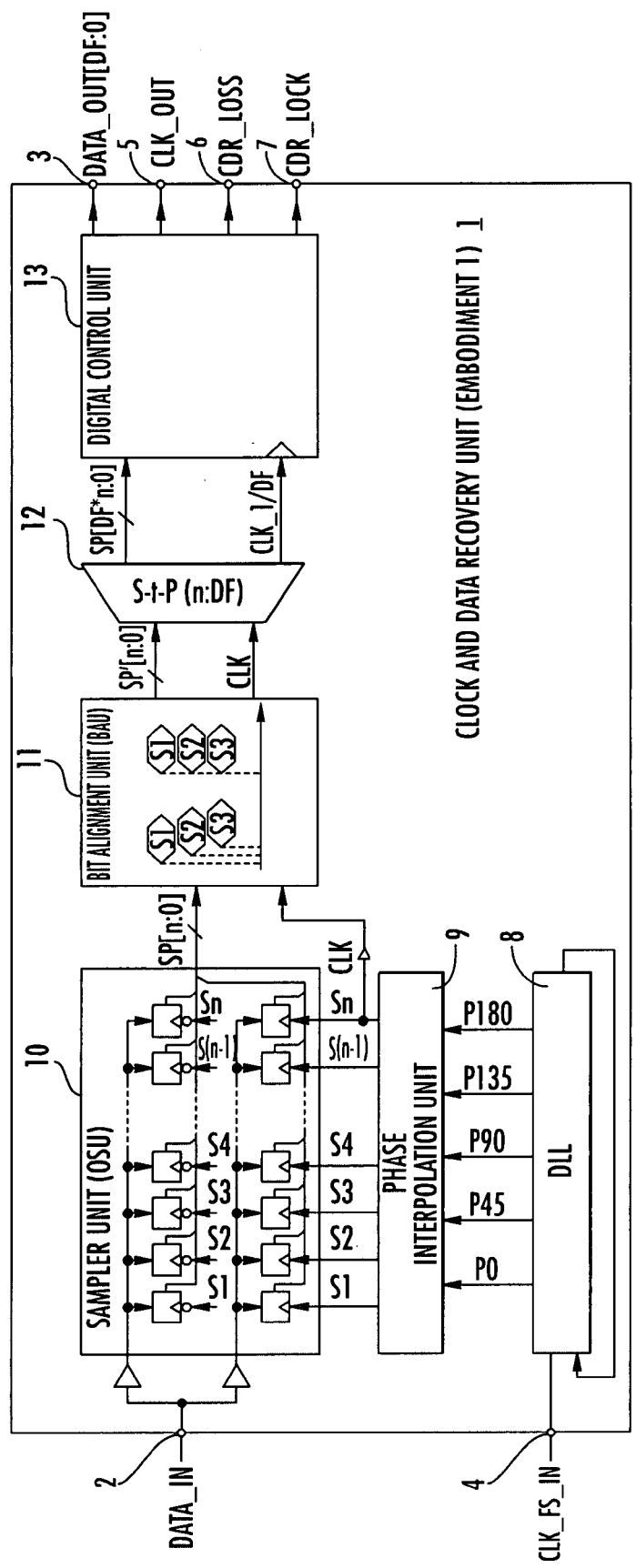
FIG. 4 shows a preferred embodiment of the feed forward clock and data recovery unit according to the present invention.

As can be seen from FIG. 4 the feed forward clock and data recovery unit 1 comprises a data input 2 for receiving the serial data bit stream over a data transmission channel. The recovered data streams are output by the clock and data recovery unit 1 via a data output terminal 3.

The feed forward clock and data recovery unit 1 further comprises a reference clock input terminal 4 for receiving a reference clock signal from a clock signal generator or a system clock signal. The recovered clock signal of the received serial bit stream is output by the feed forward clock and data recovery unit 1 via a clock output terminal 5. Further an output terminal 7 is provided for indicating that the feed forward clock and data recovery unit 1 has locked to the serial data bit stream. If the received serial data bit stream is interrupted or stopped this is indicated by the output terminal 6 of the clock and data recovery unit 1.

The feed forward clock and data recovery unit 1 according to the present invention comprises a delay locked loop 8 which generates equidistant reference phase signals Pi on the basis of the received reference clock signal applied to clock input terminal 4.

The reference phase signals Pi are equidistant reference phase signals, i.e. the phase difference $\Delta\phi$ between the reference phase signal is constant.

The clock and data recovery unit 1 as shown in FIG. 4 further comprises a phase interpolation unit 9 which interpolates the generated reference phase signals $P_i$ and outputs the phase signal with a predetermined granularity.

The phase signal $S_{xy}$ which has a phase between a first reference phase of e.g. 0° and a second reference phase of e.g. 45° is generated by adjusting the gain coefficients of the respective signal amplifiers within the phase interpolation unit 9 and by performing a summation of the weighted signals. The more reference phase signals $P_i$ are generated by the delay locked loop 8 the higher is the accuracy of the phase interpolation performed by the phase interpolation unit 9.

The interpolated phase signals $S_i$ are supplied by the phase interpolation unit 9 to a oversampling unit 10 of the feed forward clock and data recovery unit 1. The oversampling unit 10 receives the supplied serial data bit stream via buffers. The received data bit stream is oversampled by means of the interpolated reference phase signals $S_i$ according to a predetermined oversampling rate (OSR).

The output of the oversampling unit 10 is connected via a bit alignment unit 11 to a serial-to-parallel-conversion unit 12 which converts the oversampled data stream into a deserialized data stream with a predetermined decimation factor (DF). The width of the deserialized data stream is defined by the product of the oversampling rate (OSR) and the decimation factor (DF).

Figure 5:
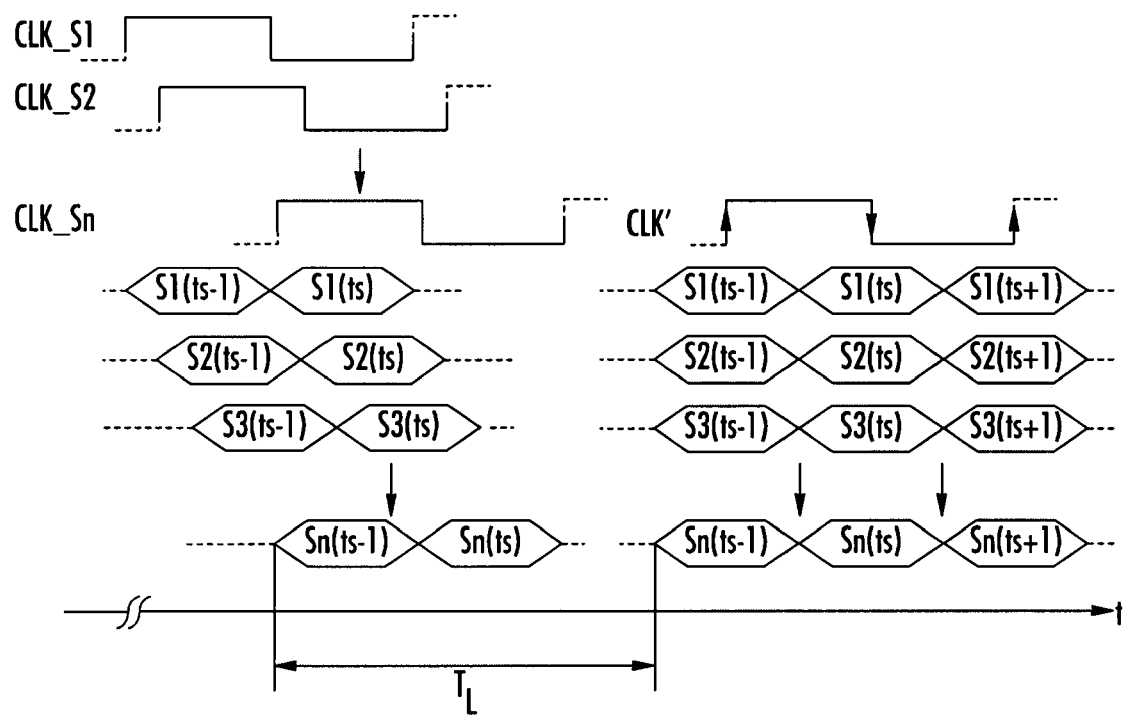
FIG. 5 shows a signal timing diagram to illustrate the functionality of the bit alignment unit provided in a preferred embodiment of the feed forward clock and data recovery unit according to the present invention.

FIG. 5 shows a timing diagram to illustrate the functionality of the alignment unit 11. The data samples generated by the oversampling unit 10 which belong to the same signal eye or unit interval (UI) have a certain relative time delay. The bit alignment unit 11 applies all data samples belonging to the same unit interval (UI) simultaneously to the serial-to-parallel-conversion unit 12.

The deserialized data stream generated by the serial-to-parallel-conversion unit 12 is supplied to a digital control unit 13 within the feed forward clock and data recovery unit 1.

Figure 6:
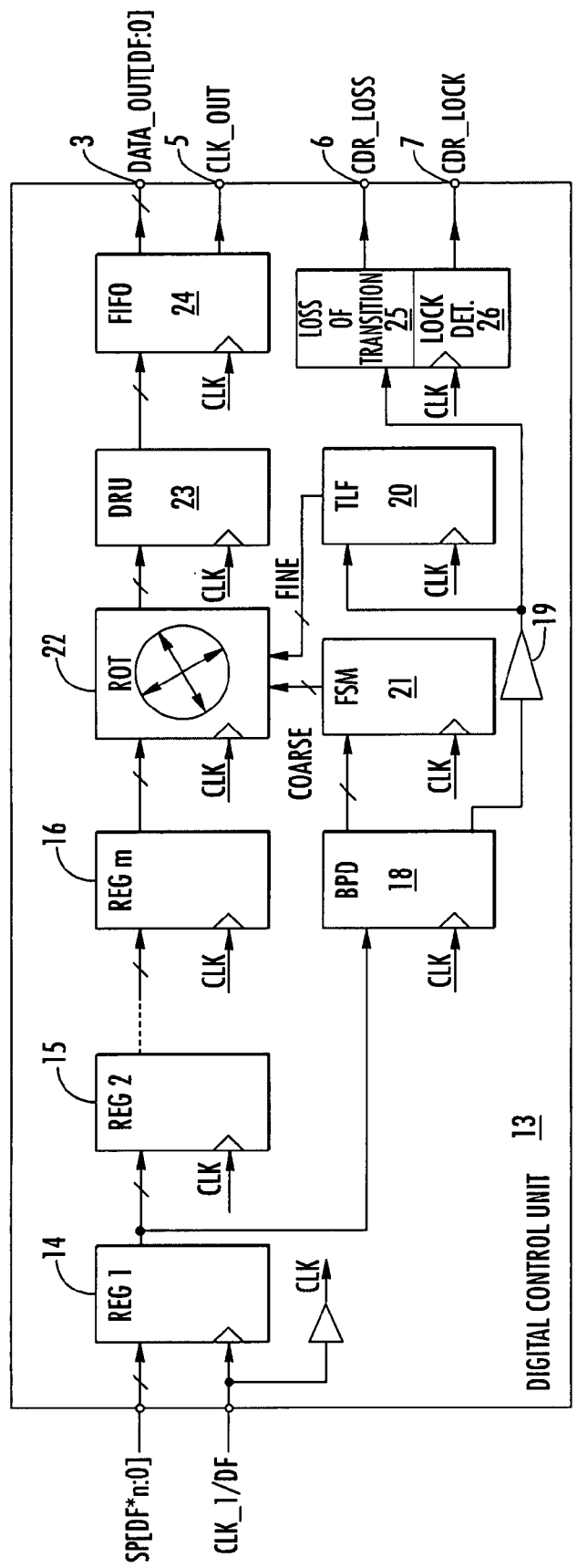
FIG. 6 shows a block diagram of a digital control unit provided in a preferred embodiment of the clock and data recovery unit according to the present invention.

FIG. 6 shows a preferred embodiment of the digital control unit 13. The digital control unit 13 comprises a first register 14 for storing the received parallised data stream from the serial-to-parallel-conversion unit 12. The digital control unit 13 comprises further registers 15, 16 to store deserialized data samples at different times, i.e. data samples of neighboring unit intervals (UI). The registers 14, 15, 16 are all clocked by an internal clock line 17 which provides a clock signal having a clock frequency which is a fraction of the clock frequency of the reference clock signal applied to the reference input terminal 4. The fraction corresponds to the decimation factor (DF) of the serial-to-parallel-conversion unit. The deserialized data samples stored in register 14 are supplied to a binary phase detection unit 18 within the digital control unit 13. The binary phase detection unit 18 is provided for detecting an average phase difference between the received serial data bit stream and the reference phase signal by adjusting a phase detector gain depending on the actual data density (DD) of the deserialized data stream such that the variation of the average phase detection gain (PDG) is minimized.

The average phase difference (AVG-PH) calculated by the binary phase detector 18 is supplied via a buffer 19 to a tracking loop filter 20 and to finite state machine 21 within the digital control unit 13. The non linear tracking loop filter 20 is provided for tracking a small phase offset of the detected average phase signal around an ideal sampling point at the center of the unit interval (UI) to generate a corresponding fine track control signal.

The finite state machine 21 detects whether the average phase difference has exceeded a predetermined phase threshold value and generates a corresponding coarse shift control signal.

The fine track control signal generated by the tracking loop filter 20 and the coarse shift control signal generated by the finite state machine 21 are supplied to a binary rotator 22 within the digital control unit 13.

The binary rotator 22 rotates the deserialized data stream stored in register 16 in response to the coarse shift control signal and in response to the fine track control signal.

The digital control unit 13 of the feed forward clock and data recovery unit 1 according to the present invention further comprises a data recognition unit 23 for recovering of the received data bit stream. The data recognition unit 23 receives the rotated deserialized data stream from the binary rotator 22. The output of the data recognition unit 23 is connected via a FIFO register 24 to the output data terminal 3 of the feed forward clock and data recovery unit 1 according to the present invention.

In a preferred embodiment the digital control unit 13 of the feed forward clock and data recovery unit 1 includes a loss of transition detection circuit 25 and a lock of detection circuit 26.

The transition loss detection unit 25 detects when the serial data bit stream applied to input terminal 2 has stopped and indicates the interruption of the received serial data by indicating a CDR-loss signal via terminal 6.

The lock detection unit 26 detects whether the clock and data recovery unit 1 is locked to the received serial data bit stream and indicates such a lock by a CDR-lock signal via terminal 7.

Figure 7A:
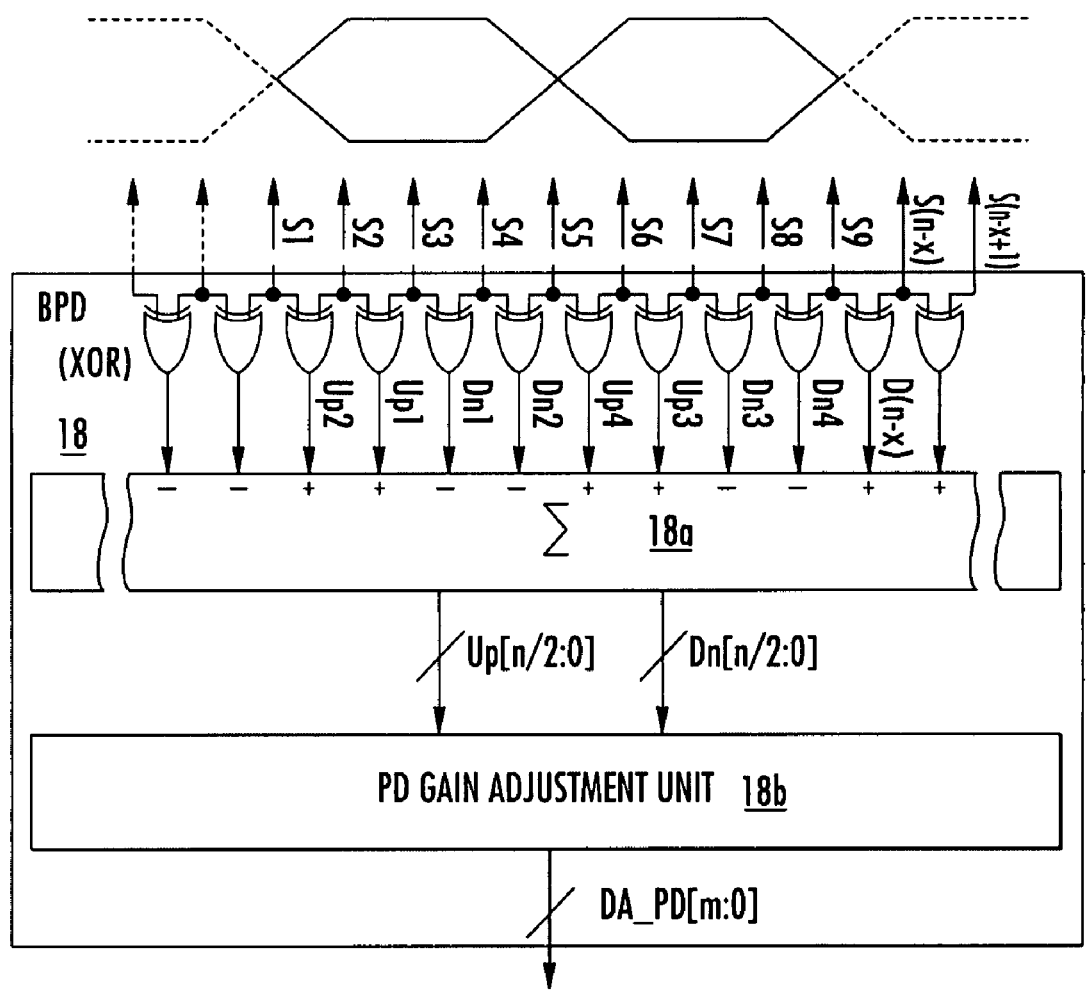
FIGS. 7a, 7b show a preferred embodiment of the binary phase detection unit according to the present invention.
Figure 7B:
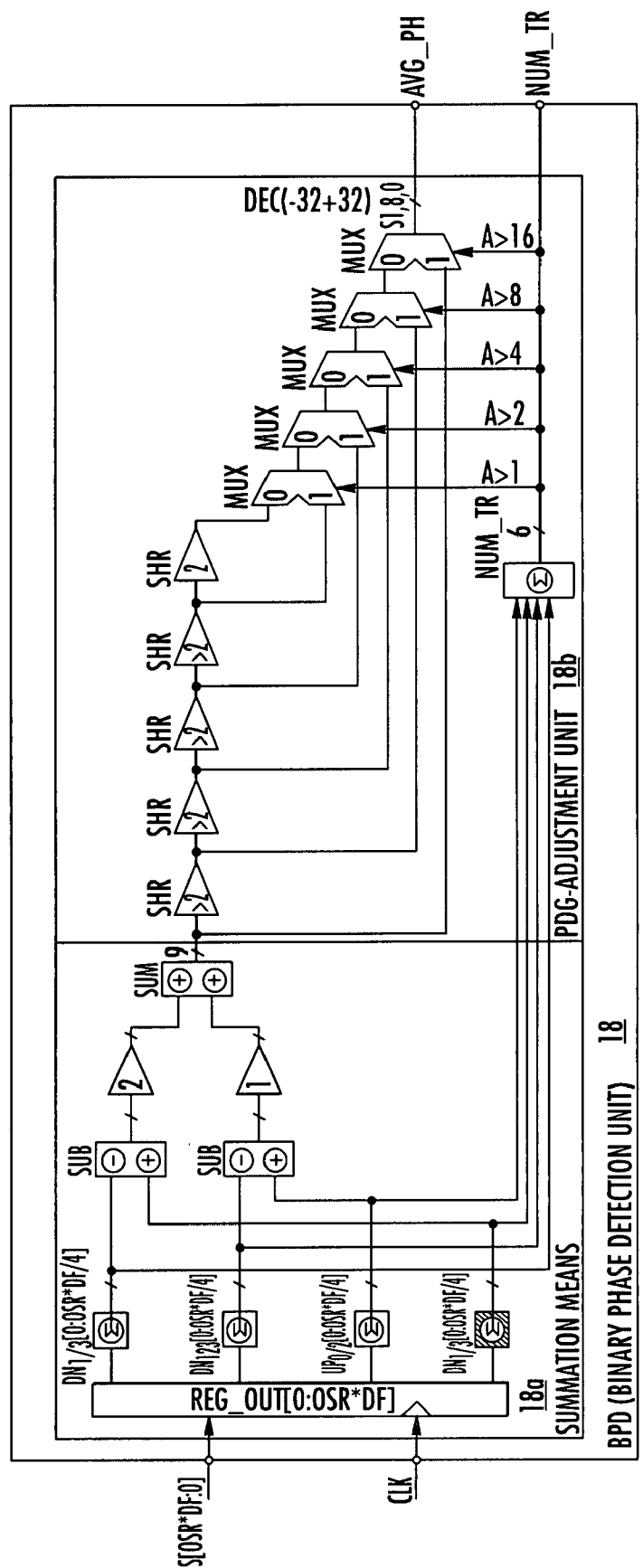

FIGS. 7a, 7b show a preferred embodiment of the binary phase detector 18 according to the present invention. The binary phase detection unit 18 within the digital control unit 13 is provided for detecting an average phase difference (APD) between the received serial data bit stream and the reference phase signal Si by adjusting a phase detector gain (PDG) depending on the actual data density (DD) of the deserialized data stream such that the variation of the average phase detection gain (PDG) is minimized.

The binary phase detection unit 18 comprises means 18a for detecting the actual data density DD of the parallised data bit stream and means 18b for adjusting the phase detector gain (PDG) depending on the detected actual data density DD. The actual data density DD is detected by a plurality of EXOR gates wherein each EXOR gate compares two neighboring data samples to decide whether a data transition has occurred. Summation means are provided for accumulating the number of transitions detected by the EXOR gates. The output of the summation means 18a is connected to the gain adjustment unit 18b for adjusting the phase detector gain (PDG).

Figure 8A:
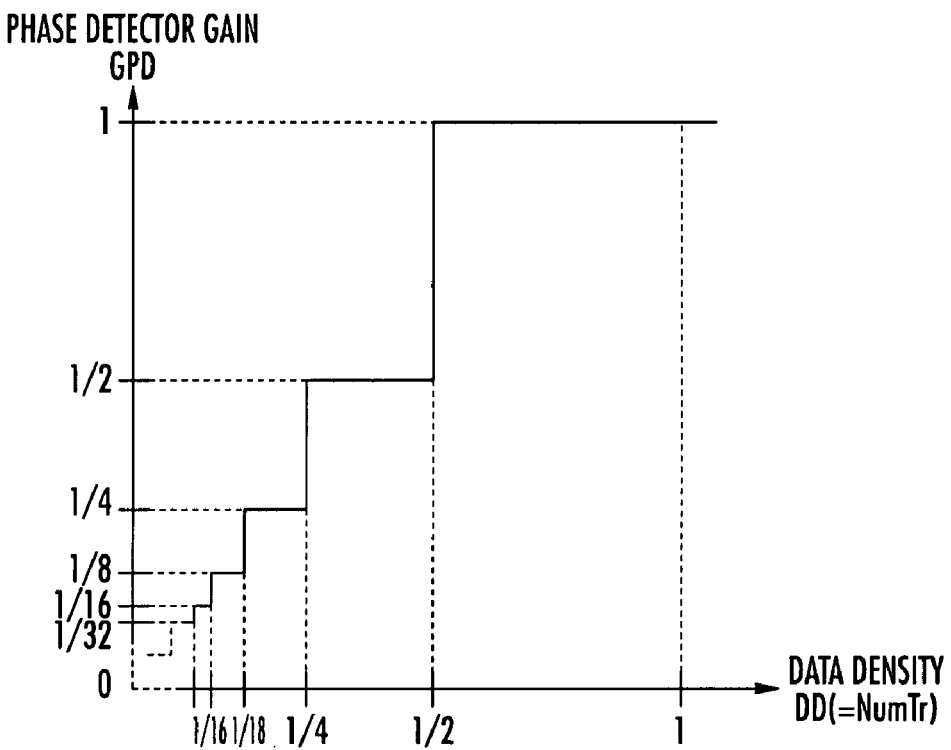
FIG. 8a shows a phase detector gain of a conventional binary phase detection unit.

FIG. 8a shows a diagram of the phase detector gain of a conventional binary phase detection unit.

Figure 8B:
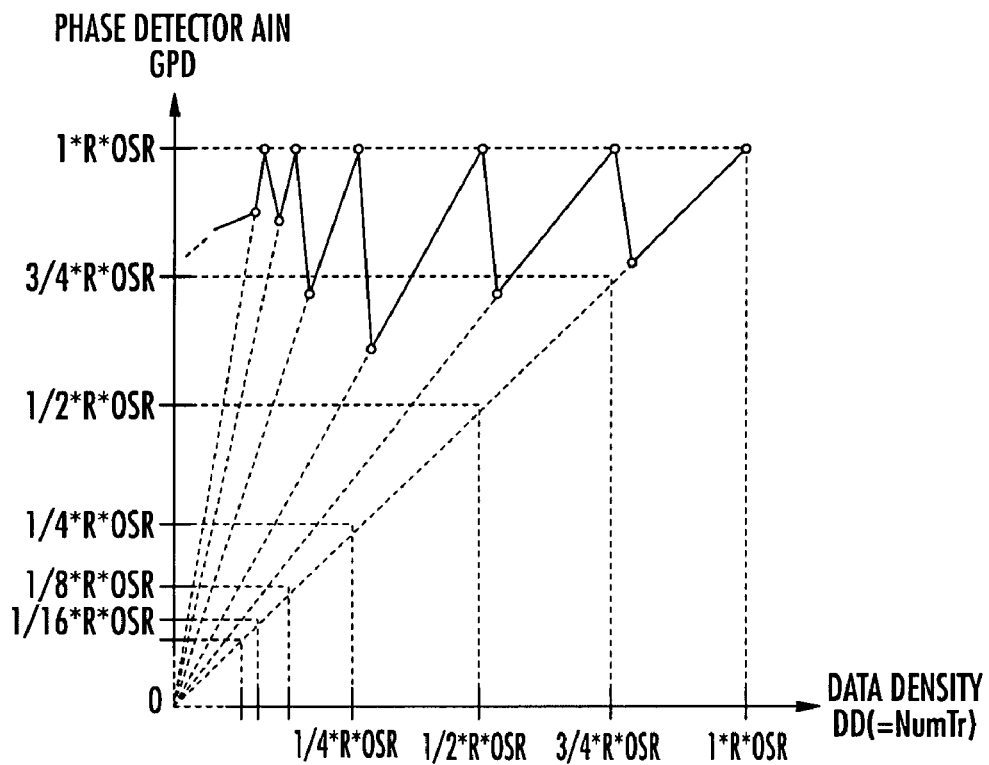
FIG. 8b shows the phase detector gain of the binary phase detection unit according to the present invention as shown in FIGS. 7a, 7b.

FIG. 8b shows a diagram to illustrate the functionality of the means 18b for adjusting the phase detector gain (PDG) depending on the detected actual data density DD within the binary phase detection unit 18 according to the present invention as shown in FIG. 7. The means 18b for adjusting the phase detector gain PDG calculate the phase detector gain (DDG) by multiplying the accumulated number of transition with a multiplication factor (MF). The multiplication factor (MF) is increased by the PD gain adjustment unit 18b when the detected number of data transitions within the received serial data bit stream has decreased.

The number of EXOR gates used for detection of the actual data density (DD) is given by the product of the decimation factor (DF) of the serial-to-parallel-conversion unit 12 and the oversampling rate (OSR) of the oversampling unit 10:

$$N = DF \times OSR$$

In a preferred embodiment of the feed forward clock and data recovery unit 1 the decimation factor DF of the serial-to-parallel-conversion unit 12 is eight (DF=8) and the oversampling rate (OSR) of the oversampling unit is four (OSR=4).

Figure 12:
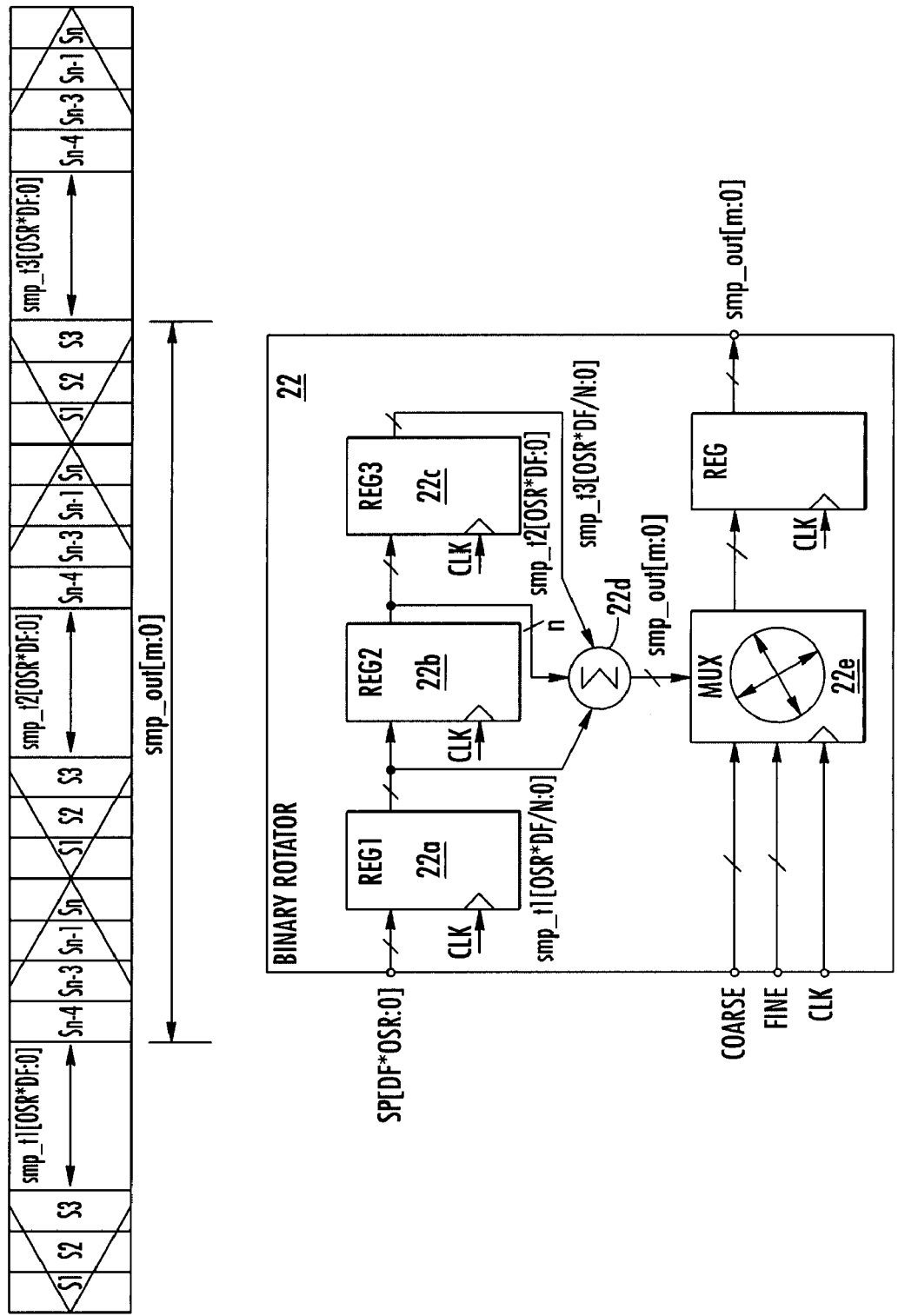
FIG. 12 shows a preferred embodiment of the binary rotator as provided within a preferred embodiment of the clock and data recovery unit according to the present invention.

Accordingly the number of EXOR gates within the binary phase detector 13b is 32 to detect up to 32 data transitions as shown in FIG. 12.

If the number of data transitions is higher than 16 the multiplication factor MF is set to 1.

If the number of transitions is between 8 and 16 the multiplication factor MF is set to 2.

If the number of data transitions is between 4 and 8 the multiplication factor MF is set to 4.

If the number of detected data transitions is between 2 and 4 the multiplication factor MF is set to 8.

If the number of detected transitions is 2 the multiplication factor is set to 16 and If the number of detected transitions is only 1 the multiplication factor MF is set to 32.

In an alternative embodiment the multiplication factor MF is normalized to the possible maximum number of transitions (NUM-TR$_{max}$=DF·OSR)

The calculated average phase signal (AVG-PH) is given by the product of the multiplication factor MF and the number of detected data transitions (NUM-TR).

The lower the data density DD of the received data bit stream is the higher is the set multiplication factor MF of the PD gain adjustment unit within in the binary phase detector 18. Accordingly the binary phase detector 18 of the invention compensates for variations of the data density DD of the received serial bit stream so that the feed forward clock and data recovery unit 1 according to the present invention becomes insensitive to variations of the data density DD.

Figure 9:
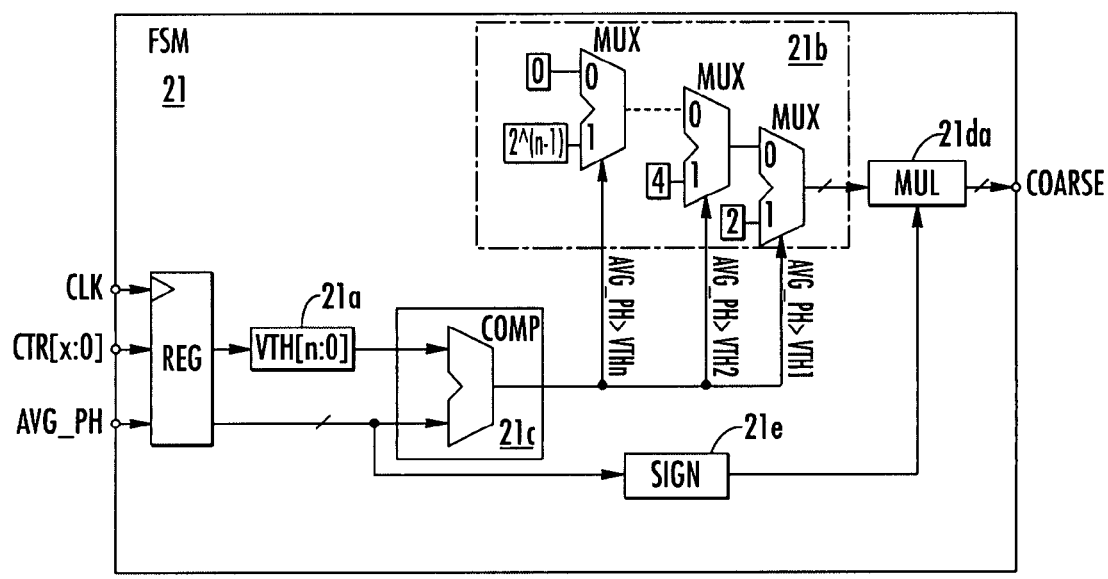
FIG. 9 shows a preferred embodiment of the finite state machine as provided within the clock and data recovery unit according to the present invention.

FIG. 9 shows a preferred embodiment of the finite state machine 21 within the digital control unit 13 as shown in FIG. 6.

The finite state machine 21 comprises a first memory 21a for storing at least one phase threshold value and a second memory 21b for storing coarse shift coefficients A$_i$.

A comparator 21c within the finite state machine 21 compares the average phase signal AVG-PH generated by the binary phase detector 18 with the phase threshold values V$_{th}$ stored in the first memory 21a. The phase threshold values are programmable. In one embodiment the differences between the phase threshold values are constant whereas in an alternative embodiment the differences between the phase threshold values are binary weighted. The number of provided phase threshold values V$_{thi}$ is also variable. When the incoming average phase signal exceeds a phase threshold value V$_{th}$ a corresponding coarse shift coefficients A$_i$ is read by the comparator 21c from the second memory 21b and provided via line to a multiplicator 21d within the finite state machine 21.

A calculation circuit 21e calculates the sign of the incoming average phase signal and applies the detected sign to the multiplicator 21d. The multiplicator 21d multiplies the detected sign of the average phase signal with the read out coarse shift coefficient A$_i$ from the memory 21b to calculate a coarse shift control signal. The coarse shift control signal calculated by the finite state machine 21 is applied to the binary rotator 22 as can be seen in FIG. 6. The coarse shift control signal is provided to compensate for big phase shifts in the received bit serial data stream detected by the binary phase detection unit 18.

Figure 10:
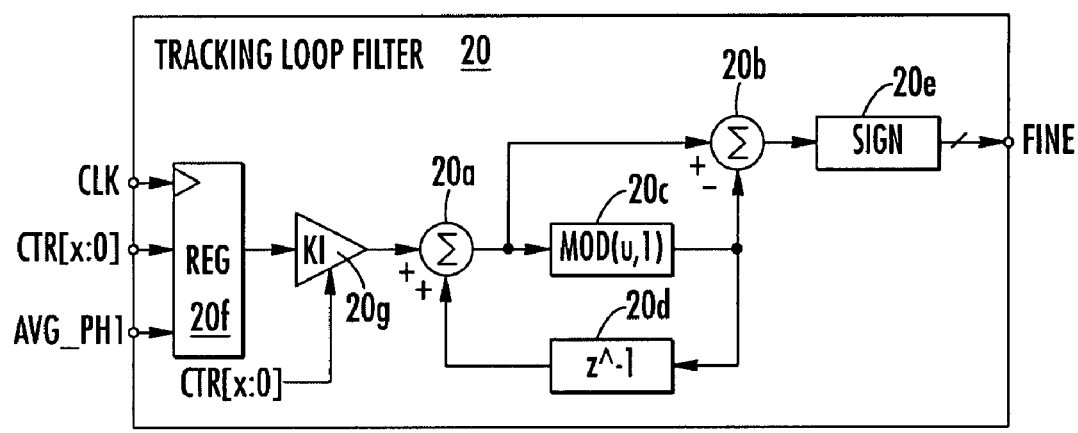
FIG. 10 shows a preferred embodiment of a tracking loop filter as provided within a preferred embodiment of the clock and data recovery unit according to the present invention.
Figure 11:
FIG. 11 shows a timing diagram to illustrate the functionality of a modulus calculation unit as employed in the tracking loop filter according to the present invention as shown in FIG. 10.

FIG. 10 shows a preferred embodiment of the tracking loop filter 20 within the digital control unit 13 as shown in FIG. 6. The tracking loop filter 20 is a non linear loop filter and provided for tracking a small phase offset of the detected average phase signal around an ideal sampling time at the center of the unit interval. The tracking loop filter 20 calculates a fine track control signal for the binary rotator 22 which is provided for compensating very small phase shifts around the ideal sampling time. The tracking loop filter 20 comprises summation means 20a the output of which is connected to a substracting means 20b and to a modulus calculation unit 20c. The summation means 20a receives the average phase signal stored in an internal register 20f amplified by means of an internal amplifier 20g comprising a controllable gain. The modulus calculation unit 20c generates a triangular output signal as shown in FIG. 11. The output signal of the modulation calculation unit 20c is feed back via a delay element 20d to the summation means 20a. The output signal of the modulus calculation unit 20c is further substracted from the output signal of the summation means 20a by means of the substractor 20b. The output signal of the substracting means 20b is output to a sign calculation means 20e which supplies the sign value as the fine track control signal via a control line to the binary rotator 22.

FIG. 12 shows a preferred embodiment of the binary rotator 22 within the digital control unit 13 of the feed forward clock and data recovery unit 1 according to the present invention as shown in FIG. 6. In the preferred embodiment as shown in FIG. 12 the binary rotator 22 comprises several registers 22a, 22b, 22c for storing data samples of the deserialized data stream at different times. As can be seen from FIG. 12 the first register 22a stores n data samples at the time t$_i$, register 22b stores, n data samples at time t$_{i+1}$ and register 22c stores n data samples at time t$_{i+2}$. All registers are clocked by the decimated clock signal applied via an internal clock line 17. The shift registers 22a, 22b, 22c are provided for storing data samples of the deserialized data stream over more than one unit interval (UI). In the shown embodiment the shift registers 22a, 22b, 22c store data samples of three neighboring unit intervals. All data samples of the register 22b are supplied via selection means 22d to a barrel shifter 22e within the binary rotator 22. Further some of the data samples in the neighboring signal eyes or unit intervals are also applied to the barrel shifter 22e. As shown in FIG. 12 three data samples for a preceeding signal eye stored in register 22 and three data samples in a following signal eye stored in register 22c are also applied to the barrel shifter 22e. The barrel shifter 22e rotates all n data samples of the central unit interval and the data samples of the preceeding and the following unit interval (UI) in response to the coarse shift control signal generated by the finite state machine 21 and in response to the fine track control signal generated by the tracking loop filter 20. The rotated signal is stored in an internal register 22f and supplied to the data recognition unit 23 as shown in FIG. 6.

Figure 13:
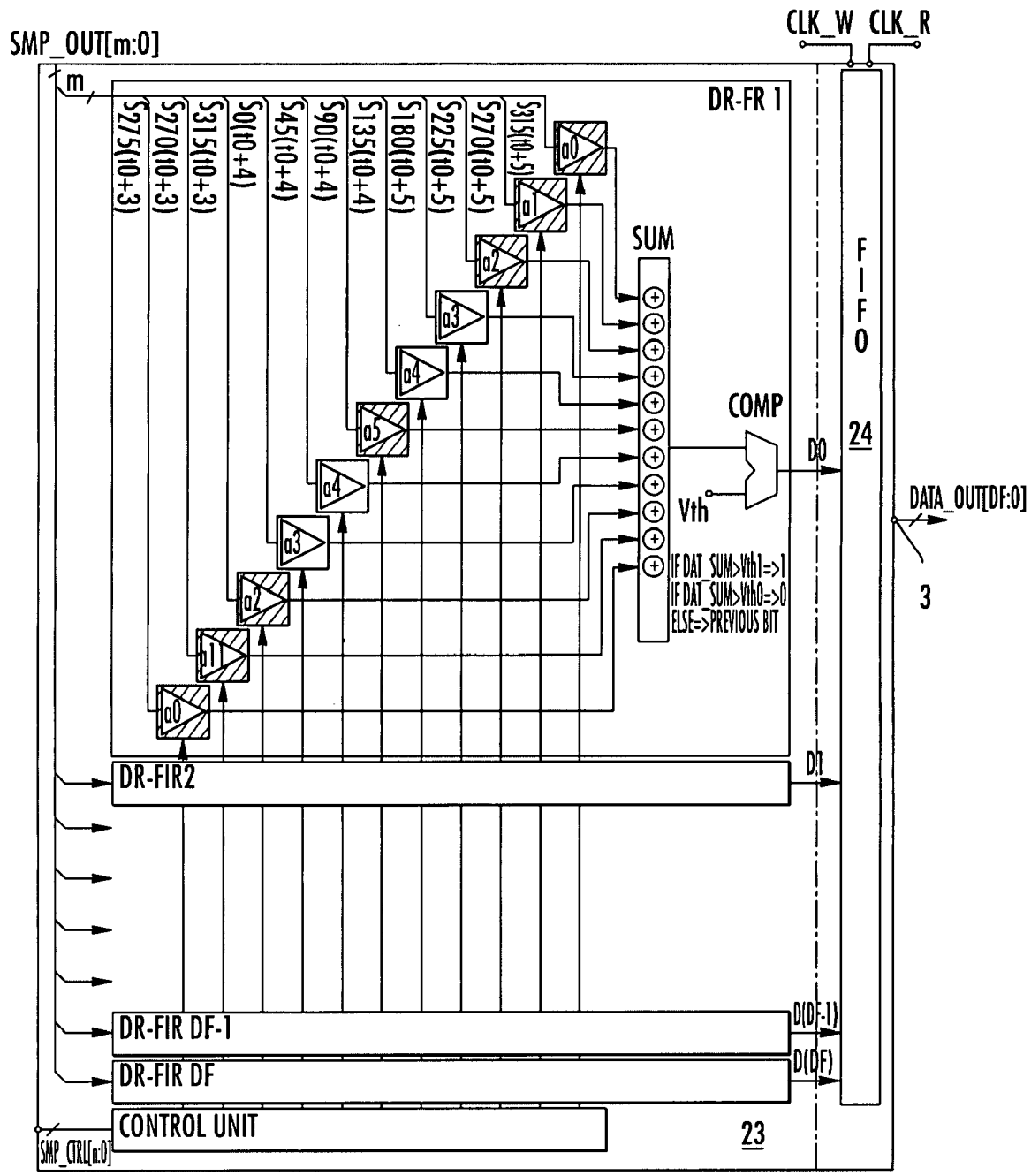
FIG. 13 shows a preferred embodiment of the data recognition unit according to the present invention.

FIG. 13 shows a preferred embodiment of the data recognition unit 23 within the digital control unit 13.

The data recognition means 23 is provided for recovery of the received data stream and comprises a number of parallel data recognition FIR-Filters DR-FIR. Each data recognition filter (DR-FIR$_i$) comprises a weighting unit for weighting the data samples of the parallised data stream around the sampling time adjusted by the phase adjustment means. Further each FIR-Filter comprises a summing unit (SUM) for summing up the weighted data samples and a comparator unit (COMP) for comparing the summed up data samples with a threshold value to detect the logic value of a data bit D$_i$ within the received serial data bit stream. If the summed up data sample is higher than a programmable first threshold value V$_{th}$ a received data bit is decided to be logic high. If the summed up data samples are lower than a programmable second threshold value (V$_{th0}$) than the received data bit decided to be logical low. The data recognition FIR-Filters DR-FIR$_i$ are connected to a FIFO-register which outputs the recovered data bit stream via an output terminal 3 of the data recovery unit 1. The number of data recognition FIR-Filters corresponds to the decimation factor (DF) of the serial-to-parallel-conversion unit 12. The data samples of the deserialized data bit stream around the sampling time are weighted by the data recognition FIR-Filters by means of amplifiers having programmable gains a$_i$. The programmable gains $a_i$ are applied to the data recognition FIR-Filters by a control unit within the data recognition unit 23.

Figure 14:
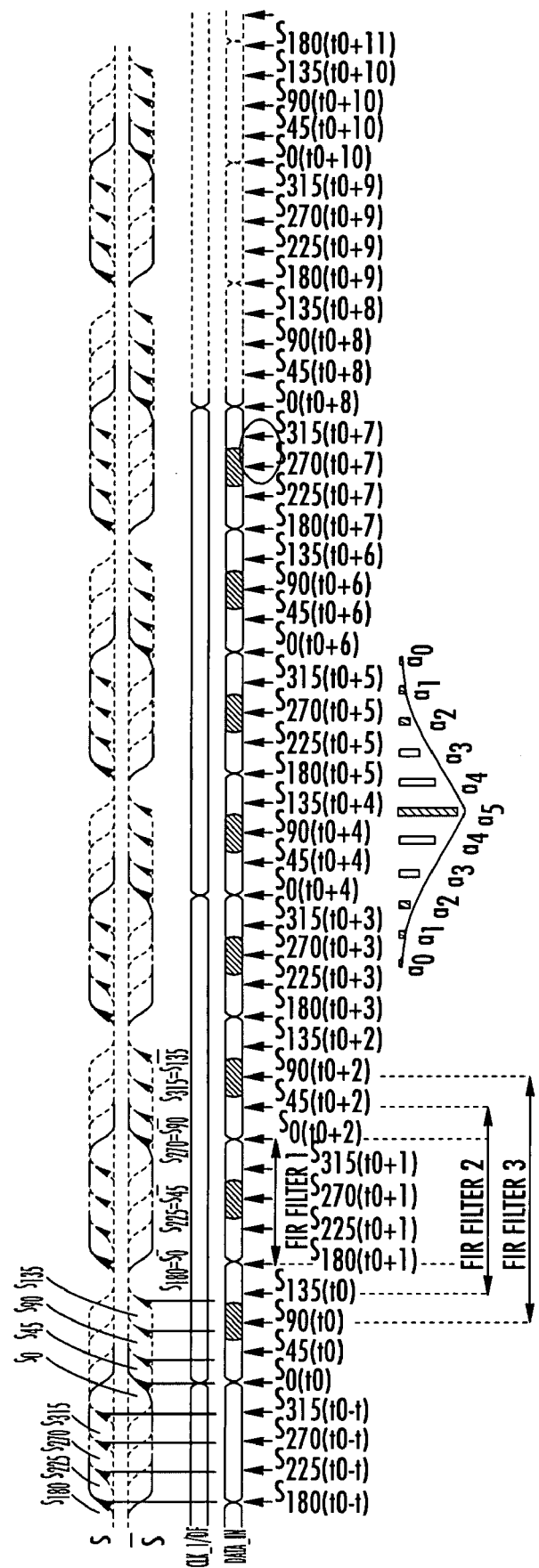
FIG. 14 shows a timing diagram to illustrate the functionality of the data recognition unit according to the present invention.

The gain $a_5$ of the data sample closest to the ideal sampling point within the center of a signal eye is set by the control unit within the data recognition unit to have the highest value as can be seen in FIG. 14. The band of the weighted data samples spread over several signal eyes as can be seen in FIG. 14. Each signal eye is evaluated separately based on the impulse response of the data recognition FIR-Filter.

Each data recognition FIR filter evaluates also data samples of least one preceding signal data eye and of at least one following signal data eye. So that the data recognition by the FIR-filter is robust against additional noise and metastability of sampling elements in the oversampling unit 10 and in the serial-to parallel conversion unit 12.

FIG. 15c shows the impulse response for three different kinds of data recognition FIR-Filters as employed in the data recognition unit 23 according to the present invention. The filter coefficients for preferred embodiments of the FIR-Filters A, B, C are shown in FIG. 15.

FIG. 15a shows the transfer function of a data recognition FIR-Filter according to a preferred embodiment.

FIG. 15b shows the corresponding impulse response of a preferred embodiment of a data recognition FIR-Filter as employed in the data recognition unit 23 according to the present invention.

Figure 16:
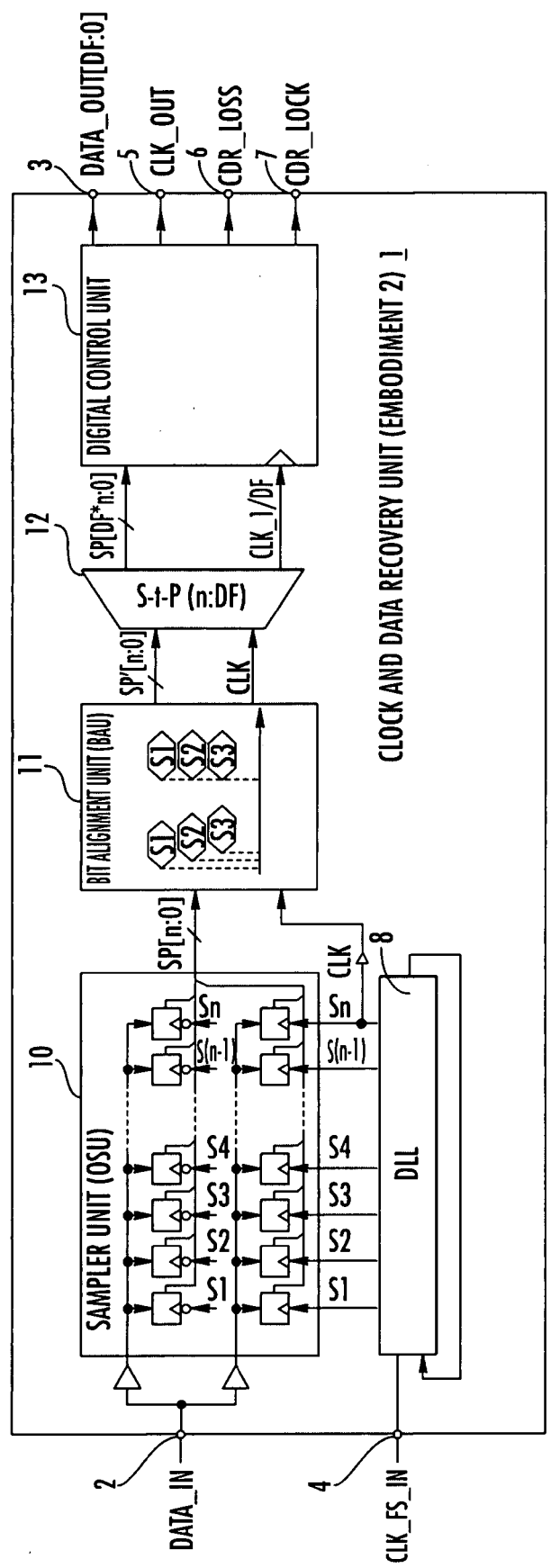
FIG. 16 shows a second embodiment of the feed forward clock and data recovery unit according to the present invention.

FIG. 16 shows a second embodiment of the feed forward clock and data recovery unit 1 according to the present invention. In the second embodiment shown in FIG. 17 no phase interpolation unit 9 is provided. The sampling phase signals Si are directly generated by the delay locked loop 8 which comprises a higher granularity than the delay locked loop in the first embodiment as shown in FIG. 4.

Figure 17:
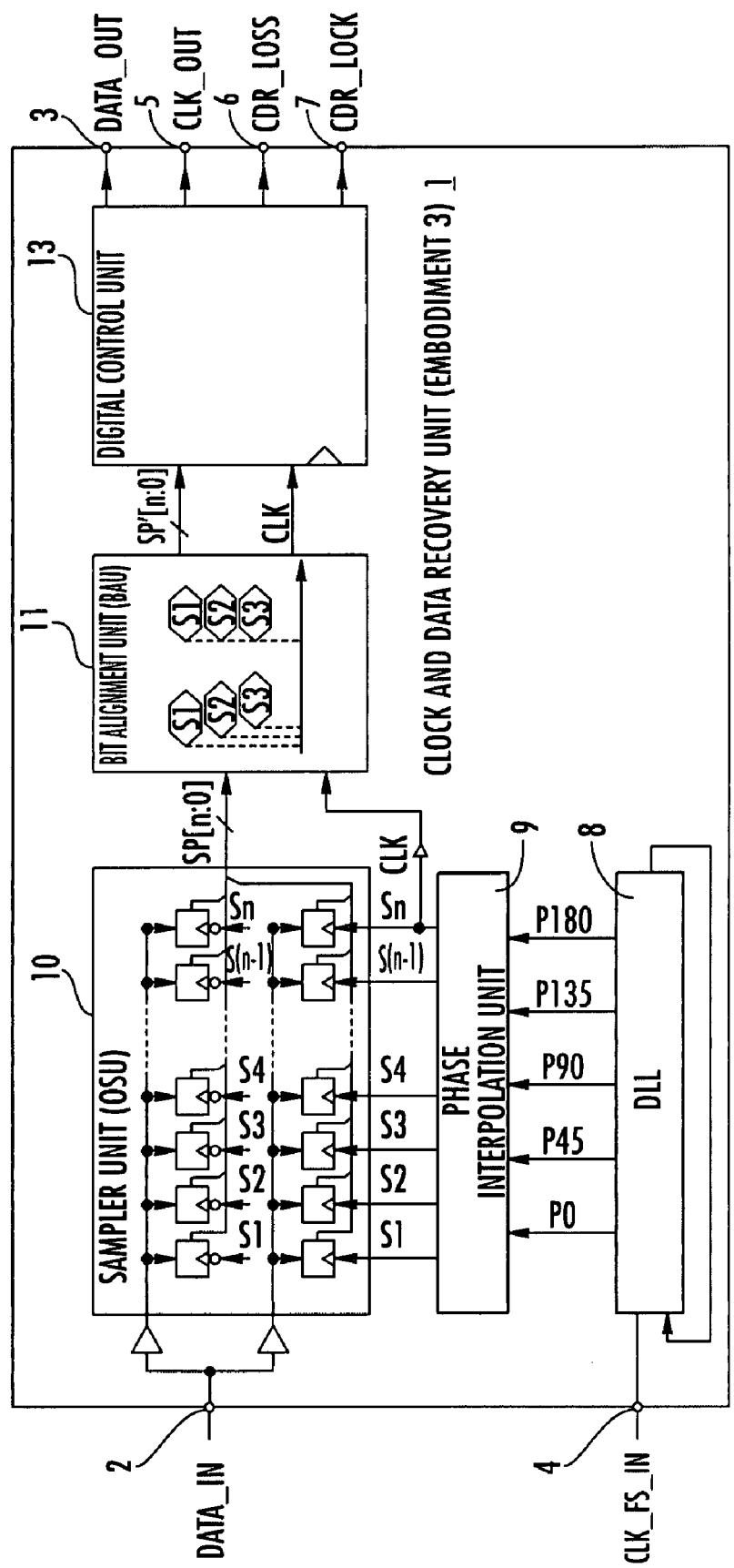
FIG. 17 shows a third embodiment of the feed forward clock and data recovery unit according to the present invention.

FIG. 17 shows a third embodiment of the feed forward clock and data recovery unit 1 according to the present invention. In this embodiment no serial-to-parallel-conversion unit 12 is provided. The data stream is provided to the digital control unit 13 directly from the bit alignment unit 11. The digital control unit 13 receives a clock signal CLK which is not decimated with a decimation factor DF.

What is claimed is:

1. A feed forward clock and data recovery unit for recovering a received serial data bit stream having:
   (a) feed forward phase tracking means for tracking of a sampling time to the center of a unit interval of the received data bit stream, wherein the feed forward phase tracking means comprises:
      (a1) sampling phase generation means for generating equidistant sample phase signals which are output with a predetermined granularity;
      (a2) an oversampling unit for oversampling the received data bit stream with the sample phase signals according to a predetermined oversampling rate;
      (a3) a serial-to-parallel-conversion unit which converts the oversampled data stream into a deserialized data stream with a predetermined decimation factor;
      (a4) a binary phase detection unit for detecting an average phase difference between the received serial data bit stream and the sample phase signal by adjusting a phase detector gain depending on the actual data density of the deserialized data stream such that the variation of the average phase detection gain is minimized; and
      (a5) a loop filter for tracking of small phase offset of the detected average phase signal around an ideal sampling time at the center of the unit interval to generate a fine track control signal;
      (a6) a finite state machine which detects whether the average phase signal has exceeded at least one predetermined phase threshold value and which generates a corresponding coarse shift control signal;
      (a7) a binary rotator which rotates the deserialized data bit stream in response to the coarse shift control signal and in response to the fine track control signal;
   (b) data recognition means for recovery of the received data stream which includes a number of parallel data recognition FIR-Filters, wherein each data recognition FIR-Filter comprises:
      (b1) a weighting unit for weighting data samples of the deserialized data stream which has been adjusted to the ideal sampling time by the binary rotator;
      (b2) a summing unit for summing up the weighted data samples; and
      (b3) a comparator unit for comparing the summed up data samples with a threshold value to detect the logic value of a data bit within the received serial data bit stream.

2. The feed forward clock and data recovery unit according to claim 1 wherein a bit alignment unit is provided which applies data samples generated by the oversampling unit within one unit interval simultaneously to the serial-to-parallel-conversion unit.

3. The feed forward clock and data recovery unit according to claim 1 wherein the finite state machine comprises a first memory for storing at least one phase threshold value; and
   a second memory for storing for each phase threshold value the corresponding coarse shift coefficient.

4. The feed forward clock and data recovery unit according to claim 3 wherein the finite state machine comprises a comparator for comparing the average phase difference with the at least one phase threshold value and outputs a corresponding coarse shift coefficient.

5. The feed forward clock and data recovery unit according to claim 3 wherein the phase threshold values are programmable.

6. The feed forward clock and data recovery unit according to claim 3 wherein the coarse shift coefficients are programmable.

7. The feed forward clock and data recovery unit according to claim 3 wherein the finite state machine comprises a multiplicator for multiplying a coarse shift coefficient output by said comparator with a sign value of the average phase difference.

8. The feed forward clock and data recovery unit according to claim 1 wherein the binary rotator comprises a shift register for storing data samples of the deserialized data stream over more than one unit interval, and a barrel shifter which rotates all data samples of one unit interval and some neighboring data samples of a preceeding and of a following unit interval in response to the coarse shift control signal and in response to the fine track control signal.

9. The clock and data recovery unit according to claim 1 wherein the binary phase detection unit comprises:
   means for detecting the actual data density of the deserialized data bit stream; and
   means for adjusting the phase detector gain depending on the detected actual data density.

10. The clock and data recovery unit according to claim 9 wherein the means for detecting the actual data density comprises a plurality of EXOR gates, wherein each EXOR gate compares two neighboring data samples generated by the oversampling unit to decide whether a data transition has occurred.

11. The clock and data recovery unit according to claim 10 wherein the means for detecting the actual data density further comprises summation means for accumulating the number of transitions detected by the EXOR gates.

12. The clock and data recovery unit according to claim 9 wherein the means for adjusting the phase detector gain calculates the phase detector gain by multiplying the accumulated number of transitions with a multiplication factor.

13. The clock and data recovery unit according to claim 12 wherein the multiplication factor is increased when the detected number of transitions is decreased.

14. The clock and data recovery unit according to claim 10 wherein the number of EXOR gates for detection of the actual data density is given by the product of the decimation factor of the serial-to-parallel-conversion unit and the oversampling rate of the oversampling unit.

15. The clock and data recovery unit according to claim 1 wherein the decimation factor of the serial to parallel conversion unit is eight.

16. The clock and data recovery unit according to claim 1 wherein the oversampling rate of the oversampling unit is four.

17. The clock and data recovery unit according to claim 1 wherein the data transmission rate of the serial data bit stream is more than one Gigabit per second.

18. The clock and data recovery unit according to claim 1 wherein the weighting unit of the data recognition means comprises signal amplifiers, wherein each signal amplifier amplifies a respective data sample with a programmable gain.

19. The clock and data recovery unit according to claim 1 wherein the data recognition FIR-Filters of the data recognition means are connected to a FIFO-memory.

20. The clock and data recovery unit according to claim 1 wherein the number of data recognition FIR-Filters corresponds to the decimation factor of the serial-to-parallel-conversion unit.

21. The clock and data recovery unit according to claim 1 wherein the oversampling unit comprises a predetermined number of clock triggered sampling elements.

22. The clock and data recovery unit according to claim 21 wherein the sampling elements are D-Flip-Flops.

23. The clock and data recovery unit according to claim 21 wherein the sampling elements are D-Latches.

24. The clock and data recovery unit according to claim 21 wherein each sampling element is clocked by a corresponding sampling phase signal generated by the sampling phase generator means.

25. The clock and data recovery unit according to claim 1 wherein the sampling phase generating means receives a reference clock signal from a reference clock generator.

26. The clock and data recovery unit according to claim 25 wherein the reference clock generator is a phase locked loop.

27. The clock and data recovery unit according to claim 1 wherein the sampling phase generating means comprises a delay locked loop for generating equidistant phase signals.

28. The clock and data recovery unit according to claim 27 wherein the sampling phase generating means further comprises a phase interpolation unit.

29. The clock and data recovery unit according to claim 27 wherein the equidistant phase signals have a phase difference $\Delta\phi$ of 45° to define eight phase segments.

30. The clock and data recovery unit according to claim 28 wherein the phase interpolation unit interpolates sample phase signals on the basis of the equidistant phase signals generated by the delay locked loop.

31. The clock and data recovery unit according to claim 1 wherein a lock detection unit is provided which detects whether the clock and data recovery unit is locked to the received serial data bit stream.

32. The clock and data recovery unit according to claim 1 wherein a transition loss the detection unit is provided which detects when the serial data bit stream has stopped.

33. The clock and data recovery unit according to claim 1 wherein the feed forward phase tracking means and the data recognition means are integrated in a digital control unit.

34. The clock and data recovery unit according to claim 27 wherein the digital control unit further includes the lock detection unit and the transition loss detection unit.

35. A feed forward clock and data recovery unit for recovering a received serial data bit stream having:
(a) feed forward phase tracking means for tracking of a sampling time to the center of a unit interval of the received data bit stream, wherein the feed forward phase tracking means comprises:
 (a1) sampling phase generation means for generating equidistant sample phase signals which are output with a predetermined granularity;
 (a2) an oversampling unit for oversampling the received data bit stream with the sample phase signals according to a predetermined oversampling rate;
 (a3) a binary phase detection unit for detecting an average phase difference between the received serial data bit stream and the sample phase signal by adjusting a phase detector gain (PDG) depending on the actual data density of the data stream such that the variation of the average phase detection gain is minimized; and
 (a4) a loop filter for tracking of small phase offset of the detected average phase signal around an ideal sampling time at the center of the unit interval to generate a fine track control signal;
 (a5) a finite state machine which detects whether the average phase signal has exceeded at least one predetermined phase threshold value and which generates a corresponding coarse shift control signal;
 (a6) a binary rotator which rotates the deserialized data bit stream in response to the coarse shift control signal and in response to the fine track control signal;
(b) a data recognition unit for recovery of the received data stream which includes a number of parallel data recognition filters, wherein each data recognition filter comprises:
 (b1) a weighting unit for weighting data samples of the data stream which has been adjusted to the ideal sampling time by the binary rotator;
 (b2) a summing unit for summing up the weighted data samples; and
 (b3) a comparator unit for comparing the summed up data samples with a threshold value to detect the logic value of a data bit within the received serial data bit stream.

36. Method for clock and data recovery of a received serial data bit stream comprising the following steps:
(a1) oversampling the received data bit stream with sampling phase signals having a predetermined granularity;

(a2) detecting an average phase difference between the received serial data bit stream and sampling phase signals by adjusting a phase detector gain depending on the data density of the data stream to minimize the variation of the average phase detector gain;
(a3) filtering the detected average phase difference to generate a fine track control signal provided for tracking a small phase of the average phase signal around an ideal sampling time of the center of the unit interval;
(a4) comparing the detected average phase difference with at least one threshold value to generate a coarse shift control signal;
(a5) rotating the data stream in response to the coarse shift control signals and in response to the fine track control signal by means of a binary rotator;
(b1) weighting data samples of the data stream around the ideal sampling time;
(b2) summing up the weighted data samples:
(b3) comparing the summed up weighted data samples with a threshold value to detect the logic value of the data bit within the serial data bit stream.

* * * * *